(12) United States Patent
Moriguchi et al.

(10) Patent No.: US 7,486,839 B2
(45) Date of Patent: Feb. 3, 2009

(54) EFFICIENT METHOD FOR MR IMAGE RECONSTRUCTION USING COIL SENSITIVITY ENCODING

(75) Inventors: Hisamoto Moriguchi, Cleveland, OH (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 639 days.

(21) Appl. No.: 10/880,329

(22) Filed: Jun. 28, 2004

(65) Prior Publication Data

US 2005/0058368 A1 Mar. 17, 2005

Related U.S. Application Data

(60) Provisional application No. 60/483,219, filed on Jun. 27, 2003, provisional application No. 60/485,823, filed on Jul. 8, 2003.

(51) Int. Cl.
*G06K 9/36* (2006.01)
(52) U.S. Cl. .................. 382/280; 382/131; 382/132
(58) Field of Classification Search ........... 382/280, 382/131–132
See application file for complete search history.

(56) References Cited

U.S. PATENT DOCUMENTS

| | | | | |
|---|---|---|---|---|
| 5,923,789 | A | * | 7/1999 | Avinash ................. 382/276 |
| 6,018,600 | A | * | 1/2000 | Levin et al. ............. 382/284 |
| 2002/0118748 | A1 | * | 8/2002 | Inomata et al. ....... 375/240.04 |

OTHER PUBLICATIONS

Oesterle C et al: "Spiral reconstruction by regridding to a large rectilinear matrix: a practical solution for routine systems." Journal of Magnetic Resonance Imaging, JMRI. Jul. 1999, vol. 10, No. 1, pp. 84-92, XP002300169 ISSN: 1053-1807, p. 84-85, p. 88.

Moriguchi H. et al: "A New Approach for Optimal Reconstruction Using Rescaled Matrices from Non-uniformly Sampled K-space Data" Proc. Intl. Soc. Mag. Reson. Med, Online! Jun. 16, 2003, XP002300967 ISSN: 1542-4428.

Kholmovski E.G. et. al: "Popsense: POCS-based method for reconstruction from sensitivity-encoded data" Proceedings of the 10th Annual Scientific Meetingof International Society for Magnetic Reasonance in Medicine, 2002, page pp. 194, XP002300561 Honolulu.

(Continued)

*Primary Examiner*—Brian Q Le
*Assistant Examiner*—Tsung-Yin Tsai (57) ABSTRACT

SENSitivity Encoding (SENSE) has demonstrated potential for significant scan time reduction using multiple receiver channels. SENSE reconstruction algorithms for non-uniformly sampled data proposed to date require relatively high computational demands. A Projection Onto Convex Sets (POCS)-based SENSE reconstruction method (POCSENSE) has been recently proposed as an efficient reconstruction technique in rectilinear sampling schemes. POCSENSE is an iterative algorithm with a few constraints imposed on the acquired data sets at each iteration. Although POCSENSE can be readily performed on rectilinearly acquired k-space data, it is difficult to apply to non-uniformly acquired k-space data. Iterative Next Neighbor re-Gridding (INNG) algorithm is a recently proposed new reconstruction method for non-uniformly sampled k-space data. The POCSENSE algorithm can be extended to non-rectilinear sampling schemes by using the INNG algorithm. The resulting algorithm (POCSENSINNG) is an efficient SENSE reconstruction algorithm for non-uniformly sampled k-space data, taking into account coil sensitivities.

4 Claims, 8 Drawing Sheets

OTHER PUBLICATIONS

Salem K A et al: "Optimization of noisy nonuniform sampling and image reconstruction for fast MRI using a human vision model" Proceedings of the SPIE—The International Society for Optical Engineering SPIE—Int. Soc. Opt. Eng USA, vol. 4324, 2001, pp. 82-90, XP002300171 ISSN: 0277-786X.

Desplanques B et al: "Iterative reconstruction of magnetic resonance images from arbitrary samples in k-space" IEEE Transactions on Nuclear Science IEEE USA, vol. 49, No. 5, 2002, pp. 2268-2273, XP002300172, ISSN: 0018-9499.

O'Sullivan J D: "A Fast Sinc Function Gridding Algorith for Fourier Inversion in Computer Tomography" IEEE Transactions on Medical Imaging, IEEE Inc. New York, US, vol. MI-4, No. 4, Dec. 1, 1985, pp. 200-207, XP000743791 ISSN: 0278-0062.

* cited by examiner

EFFICIENT METHOD FOR MR IMAGE RECONSTRUCTION USING COIL SENSITIVITY ENCODING

CROSS-REFERENCE TO RELATED APPLICATIONS

This application incorporates by reference in entirety, and claims priority to and benefit of, the following patent applications: U.S. Provisional Patent Application 60/483,219 (filed on 27 Jun. 2003); U.S. Provisional Patent Application 60/485,823 (filed on 8 Jul. 2003). This application also incorporates by reference in its entirety U.S. Utility patent application Ser. No. 10/840,412 (filed on 5 May 2004).

BACKGROUND

The systems and methods described herein relate to magnetic resonance imaging ("MRI") in general, and more particularly to a reconstruction method for sensitivity encoding with non-uniformly sampled k-space data.

Magnetic resonance imaging is a diagnostic imaging modality that does not rely on ionizing radiation. Instead, it uses strong (ideally) static magnetic fields, radio-frequency ("RF") pulses of energy and magnetic field gradient waveforms. More specifically, MR imaging is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

Programmed steps for collecting data, which is used to generate the slices of the diagnostic image, are known as an MR image pulse sequence. The MR image pulse sequence includes magnetic field gradient waveforms, applied along three axes, and one or more RF pulses of energy. The set of gradient waveforms and RF pulses are repeated a number of times to collect sufficient data to reconstruct the slices of the image.

For image reconstruction, the collected k-space data are typically reconstructed by performing an inverse Fourier transform (IFT). However, in certain experimental settings, such as spiral acquisition techniques and non-rectilinearly sampled data, image reconstruction is not simple and artifacts, such as blurring due to off-resonance effects have to be corrected. Typically, a large number of 2D-FFTs have to be performed if the data set is large, which may cause impractical and unacceptable delays in image processing. Moreover, sensing coils employed in MR image acquisition can have different and complex sensitivity profiles, which may make reconstruction from non-uniformly sampled k-space data impractical or at least difficult.

SUMMARY OF THE INVENTION

Accordingly, it is desirable to provide a more efficient method for MR image reconstruction, yielding image quality that is practically indistinguishable from that obtained using conventional image reconstruction methods. In one aspect, the disclosed methods are directed at efficient MR image reconstruction for sensitivity encoding of non-rectilinearly-acquired MRI data, e.g., data acquired by spiral imaging.

According to one aspect, the systems and methods described herein are directed at a method of reconstructing a magnetic resonance image from non-rectilinearly-sampled k-space datasets obtained from associated magnetic resonance coils, the coils having associated sensitivity profiles. The method includes: for each coil, (a) distributing the associated sampled k-space dataset on a rectilinear k-space grid; (b) inverse Fourier transforming the distributed dataset; and (c) setting to zero a selected portion of the inverse-transformed dataset and retaining a remainder portion of the inverse-transformed dataset. The method further includes combining the remainder portions of the inverse-transformed datasets for the coils into a reconstructed magnetic resonance image. The method also includes: for each coil, modifying the reconstructed magnetic resonance image based at least partially on the sensitivity profile associated with the coil, to produce a modified dataset; Fourier transforming the modified dataset; at grid points associated with the selected zeroed portion, replacing the Fourier-transformed modified dataset with the distributed k-space dataset at corresponding points of the rectilinear k-space grid, to produce an updated dataset grid; for each coil, inverse Fourier transforming the updated dataset; and for each coil, until a difference between the inverse Fourier-transformed updated dataset and the inverse Fourier-transformed distributed dataset is sufficiently small, applying an iteration of steps b through h to the inverse Fourier-transformed updated dataset.

According to another aspect, the systems and methods described herein include a method of reconstructing a magnetic resonance image from non-rectilinearly-sampled k-space datasets obtained from associated magnetic resonance coils, the coils having associated sensitivity profiles. The method includes: for each coil, distributing the associated sampled k-space dataset on a rectilinear k-space grid; for each coil, convolving the distributed dataset with a sinc function; for each coil, and at least partially based on a characteristic of the sinc function, replacing a portion of the convolved dataset with a corresponding portion of the k-space dataset distributed on the rectilinear k-space grid, to produce an updated dataset; combining the updated datasets for the coils into a combined dataset; for each coil, modifying the combined dataset based at least partially on the sensitivity profile associated with the coil; for each coil, until a difference between the modified dataset and the distributed dataset is sufficiently small, applying an iteration of steps b through e to the modified dataset.

Further features and advantages of the present invention will be apparent from the following description of preferred embodiments and from the claims.

BRIEF DESCRIPTION OF THE DRAWINGS

The following figures depict certain illustrative embodiments of the systems and methods described herein, in which like reference numerals refer to like elements. These depicted embodiments are to be understood as illustrative, and not as limiting in any way.

DETAILED DESCRIPTION OF CERTAIN ILLUSTRATED EMBODIMENTS

The methods described herein are directed, inter alia, to efficient reconstruction of high-quality MR images. In particular, the methods described herein, taking into account sensitivity profiles of coils used for MR data acquisition, can be applied to non-rectilinearly sampled data and spiral MRI sampling schemes.

In one exemplary practice, an approach for optimal reconstruction using rescaled matrices from non-uniformly sampled k-space data is described. Non-rectilinear data acquisition methods have advantages over rectilinear data sampling schemes and hence are often performed in magnetic resonance imaging (MRI). For example, projection reconstruction, i.e., radial trajectories, shows reduced motion artifacts, and spiral trajectories are insensitive to flow artifacts. Image reconstruction from non-rectilinearly sampled data is not simple, because 2D-Inverse Fourier Transform (IFT) cannot be directly performed on the acquired k-space data set. K-space gridding is commonly used as it is an efficient reconstruction method. Gridding is the procedure by which non-rectilinearly sampled k-space data are interpolated onto a rectilinear grid. The use of k-space gridding allows the reconstruction of images in general non-uniform sampling schemes, and thus gives flexibility to designing various types of k-space trajectories.

Conventional gridding algorithms have been proposed that are robust to noise and do not require a significant computational burden; however, a profile distortion of the reconstructed image often appears, unless the density compensation function (DCF) is sufficiently optimized. Other proposed algorithms with improved DCF's are often complicated, and it is still difficult to calculate the 'optimal DCF' in general non-uniform sampling schemes.

Another type of conventional gridding algorithm, 'Block Uniform Resampling (BURS)', requires neither a pre- nor a post-compensation step, and the reconstructed image is usually of high quality. Although the originally proposed BURS algorithm is sensitive to noise, it has demonstrated that SVD regularization techniques can avoid amplification of these data imperfections. However, it is often difficult to determine the regularization parameters in advance, as the k-space data signal-to-noise ratio (SNR) is usually unknown before reconstruction.

Another image reconstruction algorithm, known as 'Next Neighbor re-Gridding' (NNG), obviates the complicated procedures of the gridding algorithms described above. The NNG algorithm consists of the following four steps: 1) Density compensation of k-space data; 2) Distribution of the k-space data into a large rescaled matrix by a factor of s (=2 m), where m is a small positive integer. The location of each datum in the large rescaled matrix is determined by rounding off the original k-space coordinate in the target rectilinear grid after multiplying it by the same factor s. If more than one datum share the same matrix coordinate, the mean value is stored; 3) IFT of the large matrix; and 4) Extraction of the original-sized matrix at the center. In brief, each acquired k-space datum is simply shifted to the closest grid point of a finer rectilinear grid than the original grid, in order to directly perform IFT on a non-uniformly sampled k-space in the NNG algorithm. The errors caused by the data shifts are usually quite small in the reconstructed image if the scaling factor s is sufficiently large. Specifically, s=4 or 8 is sufficient in practice.

As is the case with the conventional gridding algorithm, the image quality of the NNG algorithm depends on the DCF used in step 1. In other words, non-negligible profile distortions of the reconstructed image are often observed if the DCF is not well optimized.

In one embodiment, the systems and methods described herein are directed at a new image reconstruction algorithm from non-rectilinearly sampled k-space data. The newly proposed algorithm is an extension of the NNG algorithm described above and will be referred to hereinafter as the 'Iterative Next-Neighbor re-Gridding (INNG) algorithm' as it includes an iterative approach. Although the algorithm requires a number of Fast Fourier Transforms (FFTs) of rescaled matrices larger than the original-sized rectilinear grid matrix, no pre-calculated DCFs are required in the INNG algorithm, and the reconstructed image is of high quality. When the size of the rescaled matrices is significantly large, it is often impractical to perform FFTs on them. To overcome this, a 'Block INNG (BINNG) algorithm' has been developed. In the BINNG algorithm, k-space is partitioned into several blocks and the INNG algorithm is applied to each block. It will be shown that if data imperfections are non-negligible, e.g., low data SNR and/or a small scaling factor, the background noise level in the reconstructed image is increased as the iteration progresses in the INNG/BINNG algorithms. However, the rate of the increase is usually not significant unless the data imperfections are substantial. Hence, an adequate choice of stopping criteria can reconstruct a high-quality image given non-uniformly sampled k-space data. The INNG/BINNG algorithms are a simple new approach to accurate image reconstruction and an alternative to the previously-proposed optimized gridding algorithms that does not require DCFs or SVD regularization parameter adjustments.

Basic INNG Method

Figure 1:
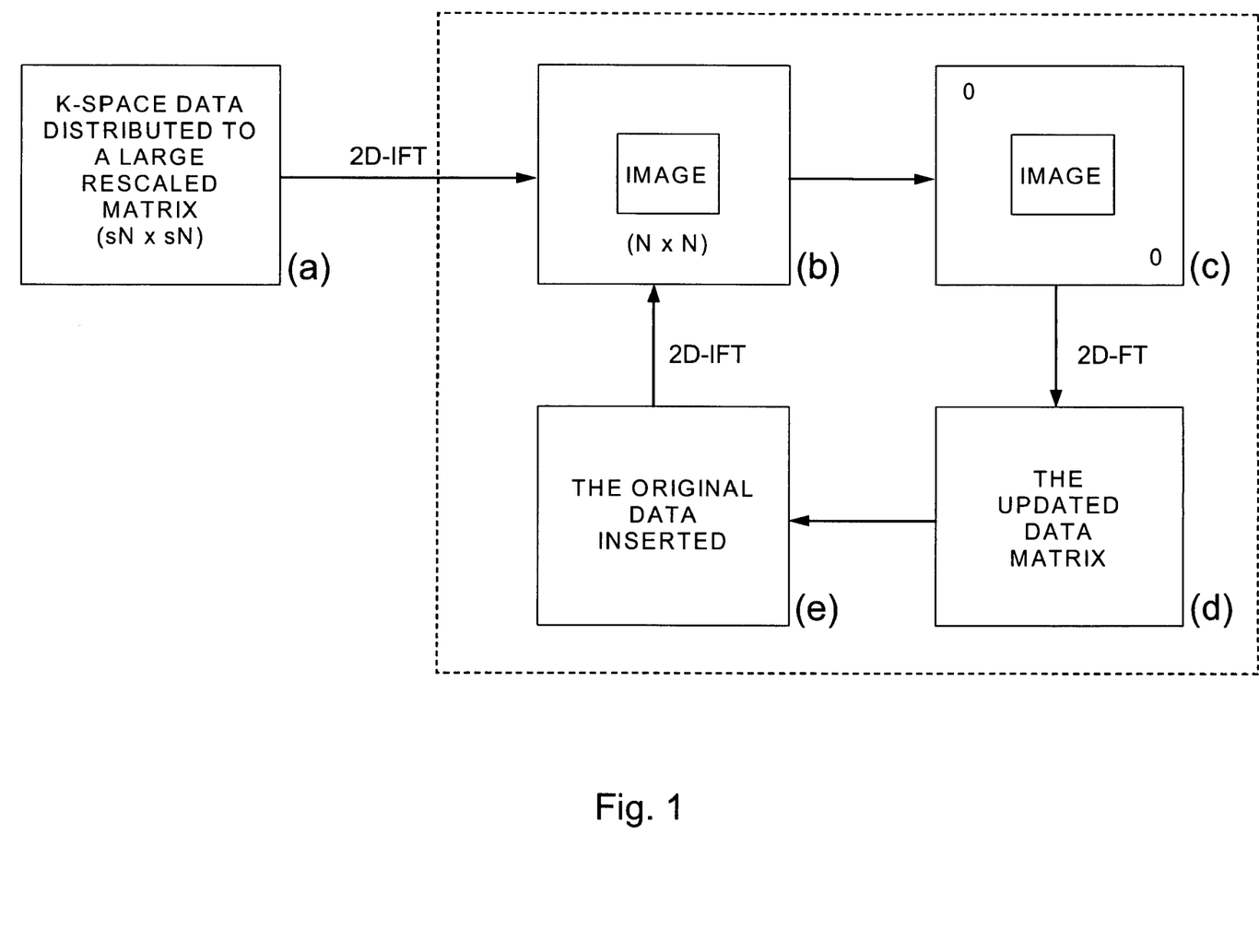
FIG. 1 depicts a flow chart of a basic INNG algorithm.

Referring now to FIG. 1, the basic procedures of the INNG algorithm are presented as a flow chart. Suppose that the originally-designed rectilinear grid size is N×N. The initial image of the INNG algorithm can be obtained by steps 2) and 3) in the Next-Neighbor re-Gridding (NNG) algorithm described above. In other words, a 2D-IFT is performed on a large rescaled matrix after k-space data are distributed without density compensation. These steps are shown by the process (a) to (b) in FIG. 1. After the initial image is reconstructed, all the matrix elements except the central N×N region are replaced by zeros. In FIG. 1, the process (b) to (c) represents this step. This procedure is equivalent to multiplication of the matrix (b) with a 2D-rect window function of amplitude 1 in the central N×N matrix and 0 elsewhere in the image. Therefore, if the matrix (c) is 2D-Fourier transformed, the obtained matrix (d) is the result of convolution of the matrix (a) with a 2D sinc function (which is 2D-FT of the 2D-rect function used in the previous process). After the matrix (d) is obtained, at the matrix coordinates where the original data exist in the rescaled matrix (a), the data are replaced by the original data values, as shown in the process (d) to (e) in FIG. 1. Other matrix elements are left unchanged in this process. Then, 2D-IFT is performed on the matrix (e) leading to the updated reconstructed image (b). The procedures (b)→(c)→(d)→(e)→(b) (surrounded by dashed lines in FIG. 1) are repeated until the difference between the updated reconstructed image (b) and the image (b) at the previous iteration becomes sufficiently small.

In the basic INNG algorithm, it is assumed that the Nyquist criterion is satisfied for the entire k-space region which spans from $-k_{max}$ to $+k_{max}$ along both $k_x$ and $k_y$ directions. In other words, at least one datum must exist in any s×s matrix region in the sN×sN rescaled matrix. In a practical implementation of the basic INNG algorithm, if there are non-sampled regions in the k-space, the corresponding regions in the rescaled matrix are set to zeros. For example, in spiral trajectories, k-space regions outside of the circle with a radius $|k_{max}|$ are usually not sampled. Correspondingly, the regions outside of the circle with a radius sN/2 are set to zeros in the sN×sN rescaled matrix, when the original data are inserted at each iteration. This procedure is also performed in the facilitated INNG algorithm and in the BINNG algorithm introduced in the following subsections.

The INNG algorithm described above can be classified as a well-known optimization method 'Projections Onto Convex Sets (POCS)'. In MRI, the POCS method has been used in half-Fourier reconstruction, motion correction and parallel imaging reconstruction. In the POCS method, each constraint can be formulated as a 'convex set', which is known in the art. In the INNG algorithm, two constraints are imposed on the data (or the image) at each iteration, that is, (i) the finite-support constraint and (ii) the data-consistency constraint. The constraints (i) and (ii) correspond to the process (b) to (c) and the process (d) to (e), respectively in FIG. 1. The constraints (i) and (ii) can be expressed as the following two convex sets $\Omega_1$ and $\Omega_2$, respectively:

$$\Omega_1 = \{I(x) | I(x_{out}) = 0\}, \quad [1]$$

where $I(x)$ is the image matrix of a large FOV (sN×sN) and $x_{out}$ represents all the matrix elements except the central N×N matrix.

$$\Omega_2 = \{I(x) | I(x) = F\{D(n)\}, D(n_{orig}) = D_{orig}(n_{orig})\}, \quad [2]$$

where F is the Fourier Transform operator, D(n) is the Fourier data matrix (sN×sN) of I(x), $n_{orig}$ represents all the elements in the larger scaled matrix where the original data exist, and $D_{orig}$ are the original data values at these coordinates.

The constraint (i) is based on the signal sampling theory in which all the sampled signals must be expressed as the summation of rectilinearly located sinc functions. If all the data values in the large rescaled matrix can be expressed as the summation of the 2D sinc functions (each of which is the FT of the 2D-rect function with amplitudes 1 in the central N×N matrix and zero elsewhere), all the image matrix elements except the central N×N region must be zeros. The need for the constraint (ii) is to keep the original data values at the original data locations for each iteration.

Suppose that the operators which project an image matrix I(x) onto $\Omega_1$ and $\Omega_2$ are $P_1$ and $P_2$, respectively. The image reconstructed using the INNG algorithm can then be expressed as:

$$I_{m+1}(x) = P_2 P_1 \{I_m(x)\}. \quad [3]$$

where the subscript of I(x) denotes the iteration number.

It can be shown that P1 and P2 satisfy the following relations:

$$\sum_x [P_1\{I_m(x)\} - P_1\{I_{m+1}(x)\}]^2 \leq \sum_x [I_m(x) - I_{m+1}(x)]^2 \quad [4]$$

$$\sum_x [P_2\{I_m(x)\} - P_2\{I_{m+1}(x)\}]^2 \leq \sum_x [I_m(x) - I_{m+1}(x)]^2 \quad [5]$$

where $$\sum_x$$

denotes summation of all the elements in the sN×sN image matrix. $P_1$ and $P_2$ are called non-expansive operators. The composite operator $P_2 P_1$ is also non-expansive, that is, $$\sum_x [I_{m+1}(x) - I_{m+2}(x)]^2 = \quad [6]$$

$$\sum_x [P_2 P_1 \{I_m(x)\} - P_2 P_1 \{I_{m+1}(x)\}]^2 \leq \sum_x [I_m(x) - I_{m+1}(x)]^2.$$

Note that Eqs. [4,5,6] hold whether or not the data are ideal. The algorithms with non-expansive operators have certain convergence properties. If the data distributed in the larger rescaled matrix are ideal, then the above iterative algorithm has a unique convergence point. However, if the errors contained in the data are non-negligible, a unique convergence point may not exist. Since both $P_1$ and $P_2$ are linear operators, $P_2 P_1$ is also a linear operator. Thus, the reconstructed image at the m-th iteration can be expressed as the summation of the image values that originate from the ideal signal components, i.e. the signal components which satisfy the condition (i) $I_{ideal,m}(x)$ and the image values that originate from the residual imperfect signal components $n_m(x)$:

$$I_m(x) = I_{ideal,m}(x) + n_m(x) (= P_2 P_1 \{I_{ideal,m-1}(x)\} + P_2 P_1 \{n_{m-1}(x)\}) \quad [7]$$

Eq. [7] suggests that the image reconstructed using the basic INNG algorithm can be regarded as the summation of the image originated from the ideal signal components $I_{m,ideal}(x)$ and the image from the residual imperfections $n_m(x)$. In other words, as iteration progresses, the RMS energy of $[I_{m,ideal}(x) - I(x)]$ is continuously decreased toward zero, and that of $n_m(x)$ is increased. However, as mentioned earlier, the increase rate of the RMS energy of $n_m(x)$ is reduced as the iteration progresses, since Eq. [6] holds for $n_m(x)$ as well.

As the iteration continues, the first term in Eq. [7] leads to the ideal reconstructed image. The second term in Eq. [7] usually manifests itself as background noise in the reconstructed image, and the noise level is increased with iterations as will be seen in the ensuing section. However, the increased rate of the noise level is reduced as the iteration progresses. This can be understood as Eq.[6] also holds for $n_m(x)$. Therefore, it is expected that if the data SNR is within a practical range, and the scaling factor s is sufficiently large, the magnitude of $I_{ideal,m}(x)$ is still predominant over that of $n_m(x)$ after a certain number of iterations.

Exemplary stopping criteria used with this algorithm are described below, although other stopping criteria can also be used. As Eq. [6] indicates, the quantity $$\sum_x [I_m(x) - I_{m+1}(x)]^2$$

monotonically decreases with iteration number m. In the present embodiment, the sum of the squared difference $[I_m(x)-I_{m+1}(x)]^2$ is calculated within the central N×N image matrix instead of the entire sN×sN image matrix to facilitate the computation. Hence, the following quantity d is measured to determine where to stop the iteration:

$$d = \sqrt{\frac{\sum_x^{N \times N} [I_{m-1}(x) - I_m(x)]^2}{N^2}} \Bigg/ \sqrt{\frac{\sum_x^{N \times N} [I_m(x)]^2}{N^2}} = \sqrt{\frac{\sum_x^{N \times N} [I_{m-1}(x) - I_m(x)]^2}{\sum_x^{N \times N} [I_m(x)]^2}}. \quad [8]$$

where $$\sum_x^{N \times N}$$

denotes summation of the central N×N image matrix elements. The iteration is stopped if d becomes lower than a predetermined value. The predetermined stopping criterion will be denoted by $d_s$ where the scaling factor is s in the following sections.

The basic INNG algorithm described above requires a number of FFTs. Furthermore, the amount of computation for each FFT is usually demanding when a rescaled matrix is large. In the following section, a 'facilitated INNG' algorithm is described which reduces the computational load of the described INNG algorithm above.

Facilitated INNG Method

Figure 2:
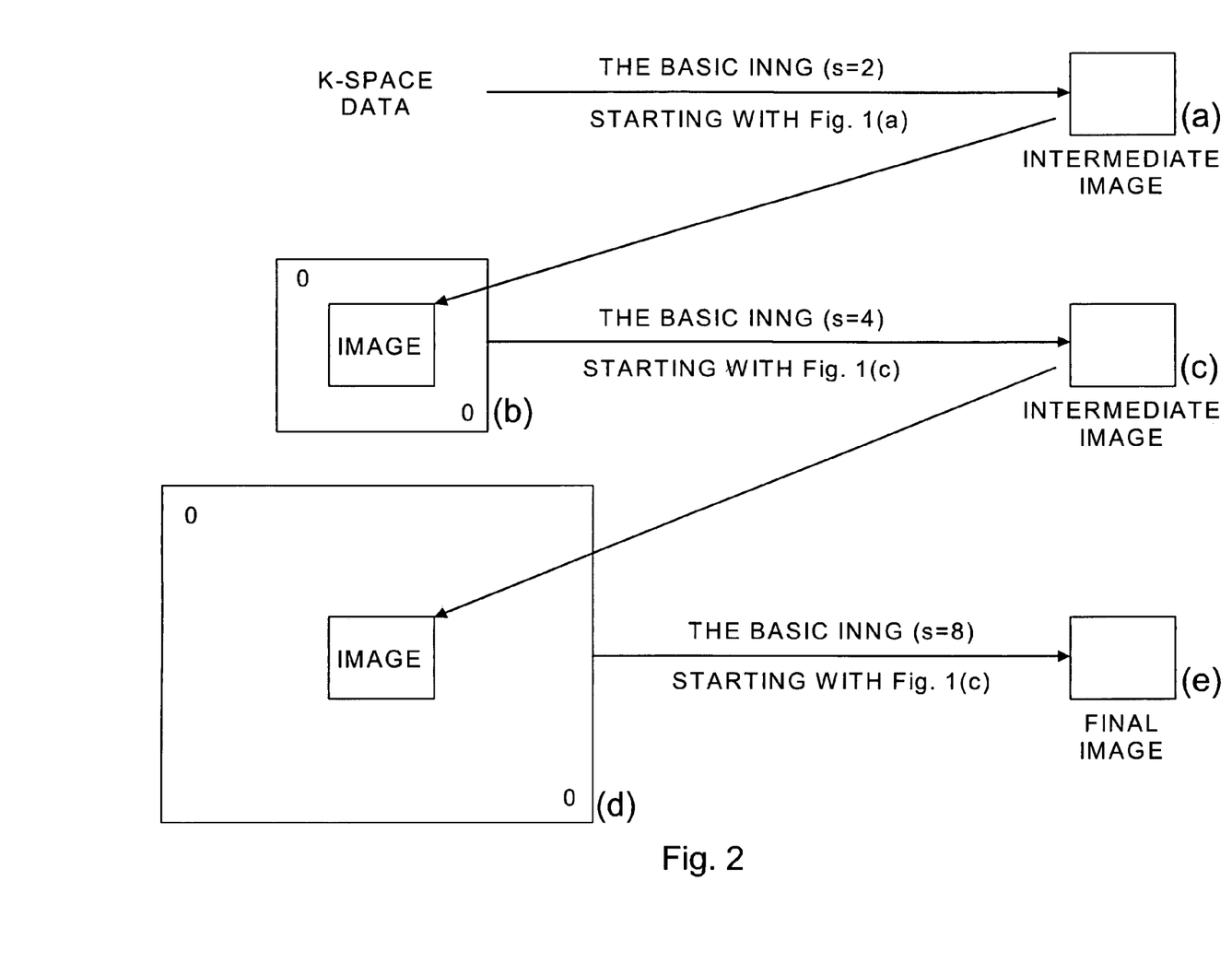
FIG. 2 depicts a flow chart of a facilitated INNG algorithm.

Referring now to FIG. 2, the facilitated INNG algorithm is shown in a flow chart. As seen from FIG. 2, the facilitated INNG algorithm modifies the basic INNG algorithm by employing consecutively increasing scaling factors. The first step of the facilitated INNG algorithm is the basic INNG algorithm with a small scaling factor, e.g., s=2. The image reconstructed from the basic INNG algorithm with s=2 ((a) in FIG. 2) is usually affected by noise because the errors caused by data shifts are significant. However, the image (a) is roughly close to the image reconstructed using the basic INNG algorithm with a larger scaling factor. Thus, the image (a) will be used for the basic INNG algorithm with s=4 in the next step. A 4N×4N zero matrix with the central N×N matrix replaced by the image (a) ((b) in FIG. 2) is a starting image matrix for the basic INNG algorithm with s=4. In general, this basic INNG algorithm with s=4 requires significantly fewer iterations than the same algorithm that starts with FIG. 1(a) to satisfy the same stopping criterion. To further reduce the errors caused by data shifts, the basic INNG algorithm with s=8 will be performed next, in a similar manner. In other words, the image (c) is transferred to the center of an 8N×8N zero matrix to form the matrix (d) as shown in FIG. 2 and it will be used as a starting image for the basic INNG algorithm with s=8. A scaling factor of 8 is usually sufficient in practice to reduce data shift errors.

In the facilitated INNG algorithm, an intermediate image reconstructed using one basic INNG algorithm is used as a starting image for the next basic INNG algorithm with a larger scaling factor. Although the final basic INNG algorithm must satisfy a rigorous stopping criterion, i.e., a small value of d in Eq.[8], in order to reconstruct a high-quality image, intermediate images do not have to satisfy a small d because they are merely 'estimate images' in the next basic INNG algorithm. Therefore, relaxed stopping criteria, i.e., relatively large d, can be used for all the basic INNG algorithms, with the exception of the last, in order to further improve the computational efficiency.

In a typical embodiment, the facilitated INNG algorithm substantially reduces the number of iterations from the basic INNG algorithm for the same target scaling factor s. In the facilitated INNG algorithm, intermediate images are used as starting images for the basic INNG algorithm with the next larger scaling factor, as shown in FIG. 2. As these images are essentially rough estimates for the next basic INNG algorithm, the number of iterations for the intermediate INNG algorithms could be reduced to further improve the computational efficiency.

Stopping criteria (used to obtain intermediate images) that are as relaxed as possible tend to avoid unnecessary computations, although it is typically difficult to determine the optimal stopping criteria in advance.

When the size of a rescaled matrix is significantly large, it is often impractical to perform an FFT on such a large matrix, and hence the INNG algorithms described above are difficult to implement. To address this problem, a Block INNG (BINNG) algorithm has been developed.

BINNG Method

Figure 3:
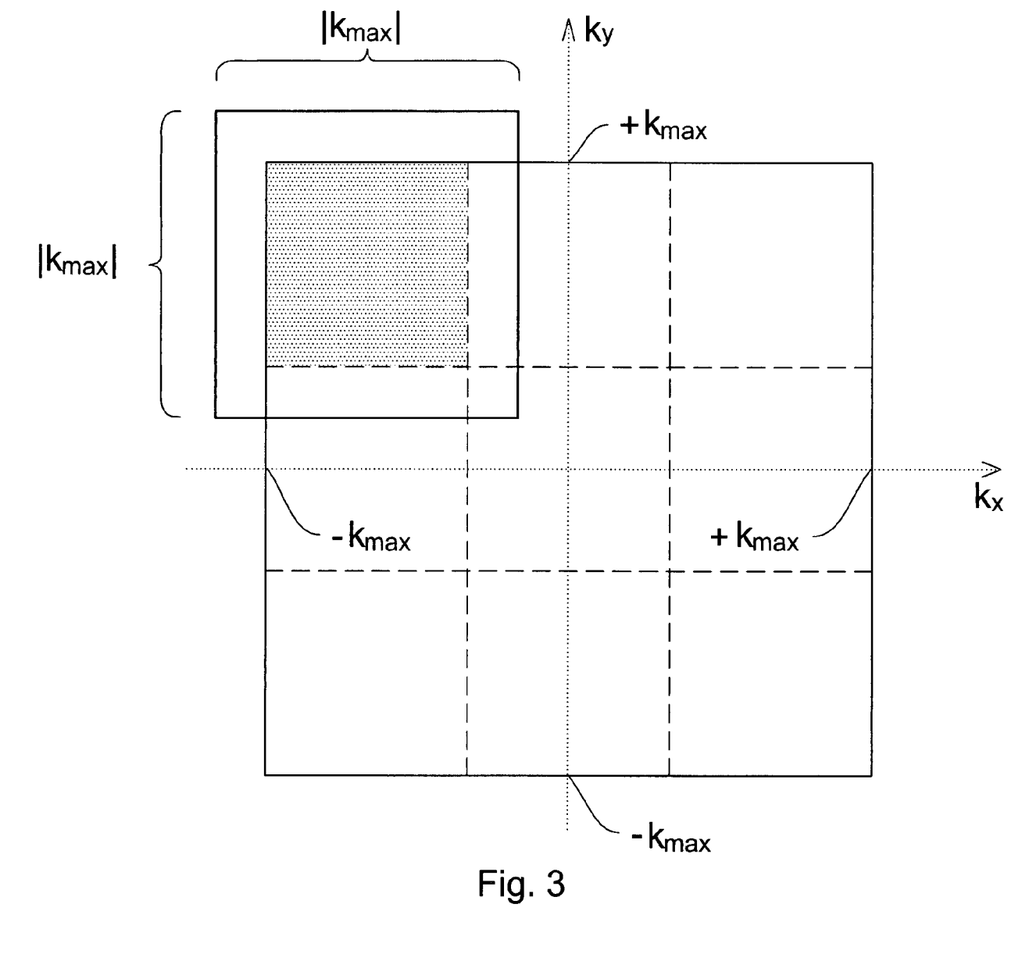
FIG. 3 depicts an exemplary partition scheme of a Block INNG (BINNG) algorithm.

FIG. 3 shows an exemplary partition scheme of the BINNG algorithm. In the BINNG algorithm, the acquired k-space region is partitioned into several blocks, and the basic or facilitated INNG algorithm is applied to each block. The sampled k-space is partitioned into, for example, 3×3 blocks. All blocks do not need to be exactly the same size. In FIG. 3, the acquired k-space region is denoted as a square with its side length 2 $|k_{max}|$. Suppose that the basic INNG algorithm is applied to the shadowed block at the upper left corner in FIG. 3. When the scaling factor is s, the k-space data that are within the square with bold lines (the side length $|k_{max}|$) are distributed to an sN/2×sN/2 matrix. Zero data values are assumed for the non-sampled k-space region within the bold square.

The basic INNG algorithm is applied to the data within the bold square region using an sN/2×sN/2 matrix as though the original target grid matrix size is N/2×N/2. In other words, 2D-IFT is first performed on the sN/2×sN/2 k-space data matrix (corresponding to (a)→(b) in FIG. 1), while zeros are set outside of the central N/2×N/2 region (corresponding to (b)→(c) in FIG. 1). A 2D-FT is subsequently performed (corresponding to (c)→(d) in FIG. 1), and the original k-space data within the bold square region are inserted into the updated sN/2×sN/2 data matrix (corresponding to (d)→(e) in FIG. 1). A 2D-IFT is then performed on the sN/2×sN/2 data matrix (corresponding to (e)→(b) in FIG. 1). The above procedures are repeated until the difference between the updated matrix (b) and the matrix (b) at the previous iteration becomes sufficiently small. It is evident that an incomplete image appears in the central N/2×N/2 region in the above iterations. However, both constraints (i) and (ii) of the INNG algorithm are effectively imposed on the sN/2×sN/2 matrix at each iteration.

As is understood from the above procedures, the facilitated INNG algorithm can also be applied to the selected k-space data set by successively increasing the scaling factor. In this case, the extracted N/2×N/2 matrix is transferred to the center of the next larger rescaled matrix of zeros after each basic INNG algorithm is performed.

The obtained sN/2×sN/2 data matrix may contain non-negligible errors in the regions close to the edges as the k-space data are abruptly truncated when they are selected. Therefore, only the part of the matrix that corresponds to the originally determined block (the shadowed region in FIG. 3) may be kept from the obtained sN/2×sN/2 data matrix.

After all the 3×3 blocks are processed in a similar manner, an sN×sN k-space data matrix can be formed. It is expected that this data matrix satisfies both conditions (i) and (ii) for the entire region. In order to reconstruct an image, as applying 2D-FFT to the sN×sN data matrix is computationally impractical (original assumption), a 2D-FFT is performed on the N×N data matrix obtained by s-fold decimation of the sN×sN data matrix.

In the above example of the BINNG algorithm, the sampled k-space region is partitioned into the exemplary 3×3 blocks, and the maximum size of the rescaled matrix is reduced to sN/2×sN/2 from sN×sN required for the INNG algorithms. Other partition schemes and block sizes are also possible. For example, when the acquired k-space region is partitioned into 5×5 blocks, the maximum size of the rescaled matrix can be reduced to sN/4×sN/4.

According to another practice, partial Fourier reconstruction techniques can be employed to reduce scan time in spiral MR sampling schemes. In one aspect, this technique employs variable-density spiral (VDS) trajectories so that the Nyquist criterion is satisfied in the central region of the k-space, whereas the outer regions of k-space are undersampled. The projections onto convex sets (POCS) method can be used in the reconstruction. The disclosed partial Fourier spiral reconstruction (PFSR) technique permits reduced scan time when compared with the conventional spiral imaging.

Although spiral imaging scan time is usually a fraction of a second, artifacts due to sufficiently rapid motion are often observable. In the technique disclosed herein, a rectilinear partial Fourier reconstruction technique has been extended to image reconstruction from undersampled spiral k-space data sets, wherein the k-space data are incompletely sampled to further reduce the scan time of spiral imaging.

The PFSR technique applies the projection onto convex sets (POCS) method (developed in rectilinear sampling schemes) to spiral sampling schemes. There are at least two constraints that are imposed on the data set at each iteration of a typical embodiment of the POCS method: (i) phase constraint in the image domain, (ii) data-consistency constraint in the k-space domain. To apply this method to spiral sampling schemes, the rescaling matrix reconstruction algorithm (the analogous algorithm has been proposed as the INNG algorithm) has been modified. A first step of this algorithm includes creating an estimated image phase map $\Phi_e$ from the low-resolution image reconstructed from the central k-space data. A next step is to perform iterative procedures to impose the two constraints on the acquired data set.

According to one practice, the PFSR algorithm follows essentially the flow of the basic INNG algorithm described above with reference to FIG. 1, except that in PFSR a phase constraint is imposed on the image (c) of FIG. 1. The original target grid is an N×N matrix. K-space data are distributed into a larger rescaled matrix by a factor of s(=2m), where m is a small positive integer (FIG. 1(a)). The location of each datum in the large rescaled matrix is determined by multiplying the original k-space coordinate by s and then rounding the rescaled coordinate off to the nearest target rectilinear grid location. If more than one datum share the same matrix coordinate, the mean value is stored. An Inverse Fourier Transform (IFT) is performed on matrix (a), leading to image matrix (b). The intermediate reconstructed image appears in the central N×N matrix in (b). The phase constraint is imposed on the central N×N image region. That is, $$I_{new} = |I_{old}| * \exp(i\Phi_e), \quad [9]$$

where $I_{old}$ and $I_{new}$ represent the image values at each pixel in the central N×N region of (b) before and after the phase constraint, respectively. The region outside of the central N×N matrix is set to zeros, resulting in (c). An FT is performed on (c), leading to (d), which is an estimate of the phase-constrained raw data. Then, a data-consistency constraint is imposed on this data matrix, i.e., the data where the original data exist are replaced by the original data values, as shown in (e). An IFT is performed on (e). The updated reconstructed image again appears in the central N×N matrix (b). The procedures (b)→(c)→(d)→(e)→(b) (surrounded by dashed lines in FIG. 1) are repeated until a difference between the updated image and the image at the previous iteration becomes sufficiently small.

The reconstructed image quality in the conventional rectilinear partial Fourier reconstruction with POCS has been shown to depend on the estimated phase, which is also the case with the PFSR algorithm discussed above. The variable-density spiral can sample the central region of k-space with little additional acquisition time as compared with a constant-density spiral. In other words, the estimated phase map can be efficiently obtained by using a VDS in the PFSR technique. Constraint (ii) is more difficult to apply when k-space data are sampled non-rectilinearly. However, the PFSR algorithm can overcome this difficulty, at least in part because it uses large rescaled (i.e., rectilinear K-space) matrices. Both constraints (i) and (ii) can be readily imposed on the data set at each of the iterations depicted in FIG. 1 with the phase constraint imposed in (c). The PFSR technique permits image reconstruction with reduced artifacts from undersampled spiral data sets, thereby enabling further reductions in scan time in spiral imaging.

According to another practice, a Block Regional Off-Resonance Correction (BRORC) can be employed as a fast and effective deblurring method for spiral imaging. Spiral acquisition techniques have advantages over other k-space trajectories because of their short scan time and insensitivity to flow artifacts, but suffer from blurring artifacts due to off-resonance effects. A frequency-segmented off-resonance correction (FSORC) method is commonly used to combat off-resonance effects and reconstruct a deblurred image. In this algorithm, several k-space data sets are first created by demodulating the original data by several different frequencies; separate images are reconstructed from each demodulated k-space data set via 2D inverse Fourier Transform (IFT). Deblurred image regions are selected from the reconstructed images under guidance of a frequency field map. The final reconstructed image with off-resonance correction is created by combining all deblurred regions selected from the appropriate demodulated image. The computational burden of FSORC is proportional to the number of demodulation frequencies used since the fast Fourier transform (FFT) is performed on each demodulated k-space data set. Hence, FSORC is often computationally intensive, particularly when a wide range of off-resonance frequencies exists across a scanned object.

Other off-resonance correction algorithms with improved computational efficiency use, for example, a linear field map which, however, can only correct for linear components of off-resonance frequency variation. Therefore, residual frequency variations that deviate from the linear variation must be corrected with FSORC; hence several FFTs are usually required. In another conventional method called multi-frequency interpolation (MFI), images are reconstructed using a reduced number of demodulation frequencies. Images requiring other demodulation frequencies are estimated from the limited set of demodulated/reconstructed images via interpolation. In MFI, the interpolation coefficients need to be pre-calculated. The total number of demodulation frequencies used in MFI is typically one-fourth to one-third that of the conventional FSORC. Image domain deconvolution methods approximate the spiral time evolution function as a quadratic function with respect to a k-space radius. This enables correction via one-dimensional deconvolution (along the x and y directions) in the image domain since separable demodulation functions along the x and y directions can be formed. However, image quality degradations beyond those associated with FSORC may result when the difference between the actual spiral time evolution function and the approximated quadratic function cannot be ignored.

Accordingly, to improve image reconstruction, a novel fast off-resonance correction method, (a.k.a., 'Block regional off-resonance correction (BRORC)') is presented. In this method, off-resonance correction proceeds block-by-block through the reconstructed image, and FFTs are performed on matrices that are smaller than the full image matrix. Although the computational cost of BRORC relative to that of FSORC depends on the selection of the parameter values in these algorithms, the BRORC is usually computationally more efficient than FSORC. Furthermore, greater reduction of the computational costs can be expected in BRORC if only particular regions of the image need to be deblurred.

Figure 4:
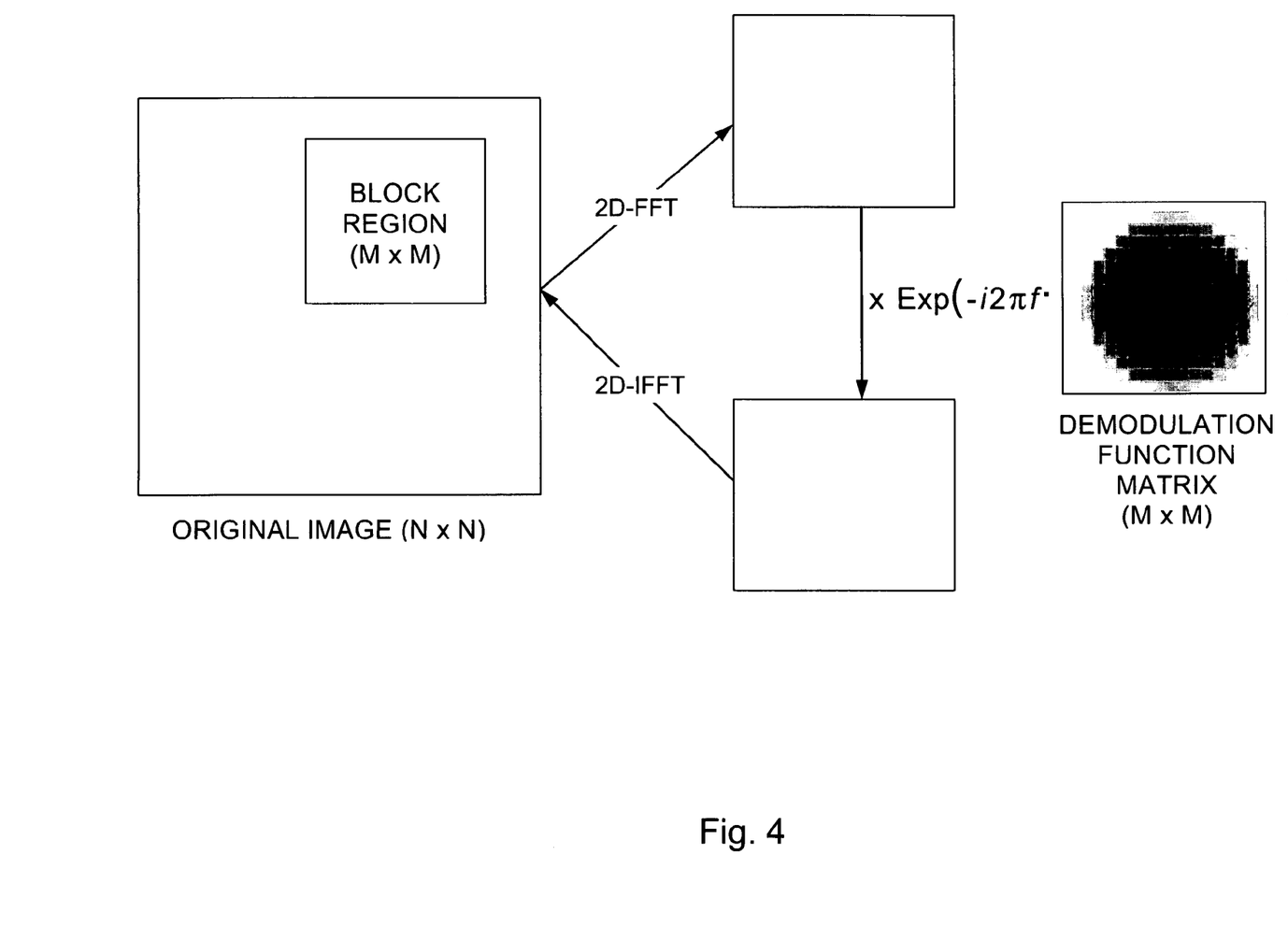
FIG. 4 depicts an exemplary block diagram of Block Regional Off-Resonance Correction (BRORC).

Referring now to FIG. 4, a block diagram of BRORC is shown having an original image matrix size of N×N (e.g., 256×256). The first step of the BRORC is to extract a small block region M×M. For convenience, M is typically chosen to be a number expressed as a power of 2 (e.g., 16, 32), though this need not be the case. A 2D-FFT is performed on the M×M image matrix. The obtained M×M Fourier data is to be frequency demodulated. The demodulation function matrix for the M×M data must also be M×M in size. This matrix can be obtained by N/M-fold decimation of the original N×N demodulation function matrix. Regions near the four corners of the M×M demodulation function matrix should be handled carefully. Normally, after the acquired spiral k-space data are gridded onto an N×N grid, there are no data outside of the inscribed circle (radius N/2 in Cartesian step). These regions are usually set to zeros in the N×N data matrix before frequency demodulation is performed. However, in the M×M Fourier data matrix, all the M×M matrix elements usually have non-zero data values. If the corresponding M×M demodulation frequency matrix has zero values in the regions near the four corners, artifacts originating from the inaccurately demodulated high spatial frequency components may appear after demodulation. Therefore, when the M×M demodulation function matrix is formed, the regions outside the inscribed circle are filled with the maximum readout time values, thereby effectively performing N/M-fold decimation without introducing such artifacts.

The demodulation frequency ('f indicated in FIG. 4) is determined from the central region of the M×M sub-image matrix in the frequency field map. In practice, the mean off-resonance frequency of the central rM×rM pixels ($0<r\leq1$, and r is typically 0.5.) in the M×M phase image matrix, is used as the demodulation frequency 'f. After frequency demodulation, the M×M k-space data is subsequently 2D-inverse Fourier transformed. Since the outer regions of the obtained M×M image matrix may exhibit artifacts, only the central rM×rM pixels of the M×M deblurred image matrix are kept for the final reconstructed image. This procedure is repeated until the entire scanned object is deblurred. However, as is evident from the BRORC block diagram, it is also possible to only deblur particular regions of the image. This is not possible with the conventional FSORC.

POCSENSINNG Algorithm

Figure 5:
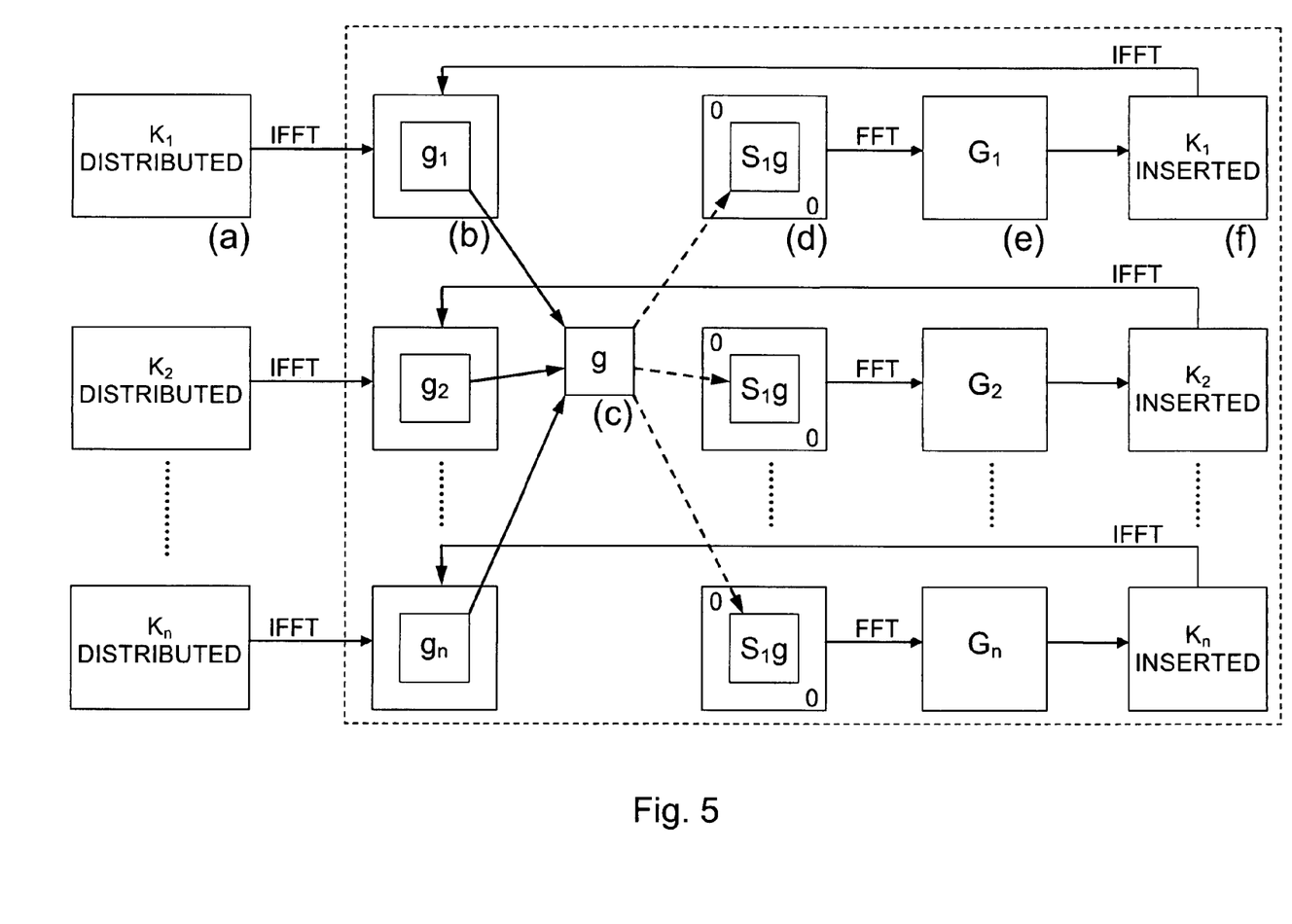
FIG. 5 depicts a flow chart of a POCSENSINNG algorithm.
Figure 6A:
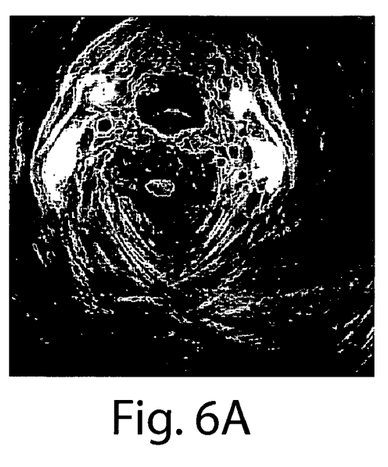
FIGS. 6(a)-6(d) depict carotid artery images acquired using four receiver channels and spiral trajectory data acquisition.
Figure 6B:
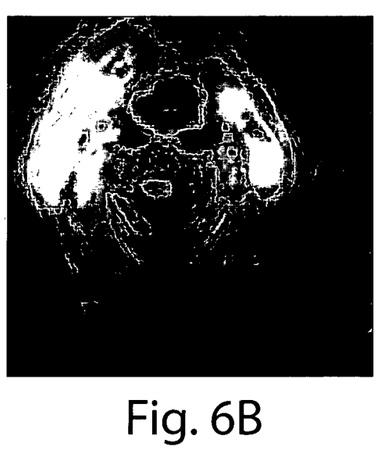
Figure 6C:
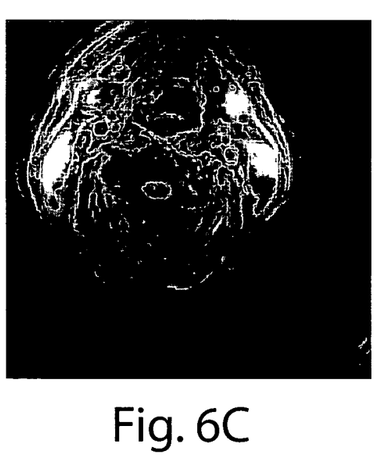
Figure 6D:
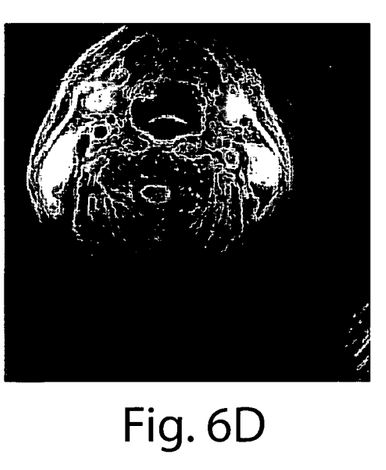

Referring now to FIG. 5, a process flow of a POCSENSINNG algorithm is depicted, which extends the Projection-Onto-Convex-Sets (POCS) reconstruction method applied to sensitivity encoding with rectilinearly sampled data (SENSE), referred to as POCSENSE, to non-uniformly sampled data. To readily impose constraints of the conventional POCSENSE algorithm on the acquired data sets, k-space datasets are distributed to larger rescaled matrices, and the INNG algorithm is applied. Compared to existing algorithms, the 'POCENSINNG' algorithm generally is a more efficient SENSE reconstruction algorithm from non-uniformly sampled k-space data.

As seen in FIG. 5, k-space data are obtained by n MRI sensing coils $K_1, K_2, \ldots, K_n$ denoting n receiver channels, respectively. According to one practice, k-space coordinates in a sampled region over the range $[-k_{max}, +k_{max}]$ are normalized to $[-N/2, +N/2]$. The sensing coils tend to have different sensitivity profiles, due, for example, to their design and/or spatial arrangement; it is desirable to take these sensitivities into account for the image analysis. If only a single coil is employed, then a single row in FIG. 5 would substantially represent the INNG process depicted in FIG. 1, with the exception of step (c) in FIG. 5. In other words, steps (c), (d) and (e) of FIG. 1 substantially correspond to steps (d), (e) and (f) in FIG. 5. If the image matrix is scaled at each step by an increasing scaling factor s, then a single row in FIG. 5 would represent the Facilitated INNG process depicted in FIG. 2.

An embodiment of the 'POCENSINNG' systems and methods described herein, e.g., the algorithm depicted in FIG. 5, initially follows steps (a) and (b) in the INNG (or Facilitated INNG) process of FIG. 1. It is assumed that an image is to be reconstructed on an N×N matrix. K-space data $K_i$ from the i-th receiver coil are first distributed onto a larger rescaled sN×sN matrix (matrix (a) for $K_1$ and additional sN×sN matrices for the $K_i$ in the same column of FIG. 5); $s=2^m$, where, typically, m is a small positive integer. In an exemplary embodiment, a location of each datum in the large rescaled matrix is determined by rounding off the original k-space coordinate after multiplying it by the scale factor s. If more than one datum share the same matrix coordinate, then, according to one practice, a mean value of the competing data is stored. In various embodiments, a variant of, or an alternative to, the mean is used; for example, a weighted mean or some other averaging measure may be employed. Inverse Fourier Transforms (IFFT) are performed on the matrices (a), leading to image matrices (b). Each of the $g_i$'s in FIG. 5 denotes a corresponding image that appears in the central N×N region of a corresponding matrix; one such central region is depicted by 101 of FIG. 1.

Note that one or more reconstructed image $g_i$ may be affected by aliasing artifacts due to undersampling. The $g_i$'s are combined into g, as shown in (c) in FIG. 5, using, for example and without limitation, the same method as that employed by POCSENSE:

$$g = \left(\sum_{i=1}^{n} w_i g_i S_i^*\right) / \left(\sum_{j=1}^{n} w_j S_j S_j^*\right), \quad [10]$$

$$w_i = 1/\sigma_i^2 \quad [11]$$

where $\sigma_i$ is the noise standard deviation in i-th channel, $S_i$ is the sensitivity profile of i-th coil and $S_i^*$ is its complex conjugate. After g is created using Eqs. [10-11], the image values for the region of support are maintained and those for other regions are set to zeros, i.e., $$g(x) := \begin{cases} g(x), & x \in M \\ 0, & \notin M \end{cases} \quad [12]$$

where M represents an image mask. A method to create an image mask is described by, for example, Pruessman et al., "SENSE: Sensitivity Encoding for Fast MRI," Mag. Res. Med., v. 42, pp. 952-962, 1999). Eq. [12] is one of the constraints of the POCSENSE and denoted as projection $P_3$ in Kholmovski et al., "POCSENSE: POCS-based reconstruction method for sensitivity encoded data", Proceedings of the 10th Annual Meeting of ISMRM, , p. 194, Honolulu, 2002.

At the next step, g defined by Eq. [12] is multiplied by $S_i$. This is another constraint of the POCSENSE and is denoted as projection $P_1$ in the Kholmovski reference cited above. The images $S_i$ g are set in the central N×N regions of sN×sN matrices of zeros, resulting in the matrices (d) in FIG. 5.

The various central N×N images are combined into a single image g, as indicated in step (c) of FIG. 5. According to one practice, the images are combined by using a modification of a method disclosed by the Kholmovski reference cited above. Kholmovski's method uses coil sensitivity profiles $S_i$ and alternating Projection Onto Convex Sets (POCS) formalisms to recover missing k-space data. POCS formulation of the problem permits natural incorporation of valid constraints (coil sensitivity profiles, acquired k-space data, and image support) in the reconstruction process as convex sets. Kholmovski's method does not require any type of computationally expensive matrix inversion operation and uses computationally efficient FFTs instead.

Sensitivity profiles $S_i$ are assumed to have been previously determined for each coil. The sensitivity profile $S_i$ of i-th coil is multiplied by the single image g. The images $S_i$g are then placed in the central N×N regions of sN×sN matrices, with the remaining matrix elements set to zero (d). FFTs are then performed on the matrices (d), which transform the matrices (d) back into k-space, leading to new estimates $G_i$ of the rescaled k-space data, step (e). The original k-space data (prior to being zeroed out) from the rescaled matrices $K_i$ (as shown in (a)) are inserted into the rescaled matrices $K_i$ at their original locations, as shown in (f) and described above with reference to step (e) of FIG. 1; data in other locations are unaltered. IFFTs are then performed on the matrices (f). The updated spatial-domain images $g_i$ appear in the central N×N regions on the matrices (b). The procedures (b)→(c)→(d)→(e)→(f)→(b) (surrounded by dashed lines in FIG. 5) are repeated until a difference between the updated image g and the image $g_{prev}$ obtained at the previous iteration becomes sufficiently small. This difference can be determined either by a trained clinician or by a mathematical fit between the image data g and $g_{prev}$, such as with the criterion of Eq. [8].

A large scaling factor s would be desirable to reduce the data shift errors in the large rescaled matrices. However, as described above with reference to FIG. 2, in the context of the facilitated INNG algorithm, to improve the computational efficiency in the POCENSINNG algorithm, the scaling factor s can first be set to a small value (e.g., s=2) and then successively increased. A final scaling factor of 4 is usually sufficient in practice for in-vivo MR image reconstruction.

Experimental Results

The POCSENSINNG algorithm was applied to in-vivo MR data that were acquired with spiral trajectories. Data acquisitions were performed using a 1.5-Tesla Siemens Sonata scanner (Siemens Medical Solutions, Erlangen, Germany). Carotid arteries were scanned from an asymptomatic volunteer using four-element surface coils. Cardiac images were also acquired from another asymptomatic volunteer using four-element phased array torso/body surface coils. All procedures were performed under an institutional review board-approved protocol for volunteer scanning.

For the image acquisitions of carotid arteries, dual inversion recovery dark blood techniques were used for spin preparation (6). TI was set to 700 ms. 20 spiral interleaves were used with a field of view (FOV) 170×170 mm. Slice thickness 10 mm, spiral readout time 16.0 ms, and TE/TR=6.6/2000.0 ms. 1-2-1 binomial pulses were used for spatial-spectral excitation. Two spiral interleaves were successively acquired in one TR. The total flip angles for on-resonance spins were 45° (1st) and 90° (2nd).

For the cardiac image acquisitions, T2 preparation pulses were used (7). The length of T2 prep pulses was set to 30 ms. ECG gating was used during the acquisitions. 20 spiral interleaves were used with an FOV 320×320 mm. Slice thickness 7 mm, spiral readout time 18.0 ms, and TE=6.6 ms. 1-2-1 binomial pulses were used for spatial-spectral excitation. Two spiral interleaves were successively acquired for one cardiac cycle. The total flip angles for on-resonance spins were 45° (1st) and 90° (2nd).

For each reconstruction of the carotid arteries' and cardiac images, images were reconstructed from the spiral data of only 10 interleaves out of the 20 acquired interleaves. The sum-of-squares method and the POCSENSINNG algorithm were used for image reconstruction. The scaling factor s was set to 2 in the POCSENSINNG algorithm for both carotid arteries' and cardiac image reconstruction. The iteration was stopped when no significant change was observed in the updated reconstructed image. Images were also reconstructed from the spiral data of all 20 acquired interleaves using the sum-of-squares method for comparison. All the reconstructed image matrices were 256×256 in size.

Magnetic field ($B_0$) inhomogeneity often causes blurring artifacts in spiral trajectories. Off-resonance correction were applied to the cardiac image reconstructed using the POCSENSINNG algorithm to see if the blurring artifacts were effectively reduced. The recently proposed Block Regional Off-Resonance Correction (BRORC) algorithm was applied to the selected cardiac region in this experiment.

FIG. 6 shows the carotid artery images. In (a)-(c), the images were reconstructed from the spiral data of 10 interleaves out of 20 acquired interleaves ((a): the sum-of squares method; (b): the POCSENSINNG algorithm after 1st iteration; (c): the POCSENSINNG algorithm after 10th iteration). In (d), the image was reconstructed using the sum-of-squares method from the spiral data of all 20 acquired interleaves. In (a), spiral aliasing artifacts are observed for the entire image region. As observed in (b), low spatial frequency components predominantly appear in the reconstructed image after 1st iteration in the POCSENSINNG algorithm. However, high frequency components are sufficiently exhibited in the image after 10th iteration (c). The spiral aliasing artifacts observed in (a) are effectively reduced in (c). The quality of the image (c) is almost comparable to that of the full data set image (d).

FIG. 7 shows the cardiac images. In (a)-(d), the amounts of spiral interleaves used for image reconstruction and the reconstruction methods were the same as (a)-(d) in FIG. 6, respectively. In (a), the image is affected by substantial level of spiral aliasing artifacts. In (b), as was observed in FIG. 6, low spatial frequency components predominantly appear in the POCSENSINNG image after 1st iteration. The image after 10th iteration (c) exhibits sufficient amounts of high frequency components. Although the noise levels of image (c) appear higher than that of full data set image (d) because of reduced data acquisition, the aliasing artifacts observed in (a) are effectively reduced in (c).

Figure 7A:
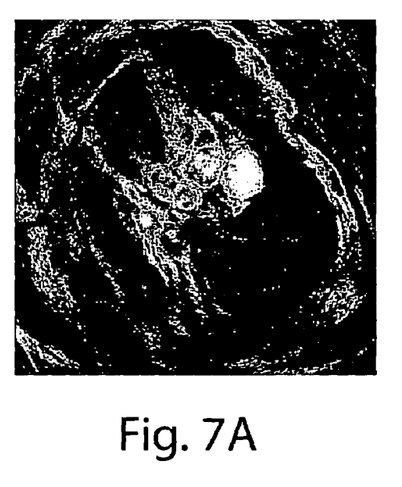
FIGS. 7(a)-7(d) depict cardiac images acquired using four receiver channels and spiral trajectory data acquisition.
Figure 7B:
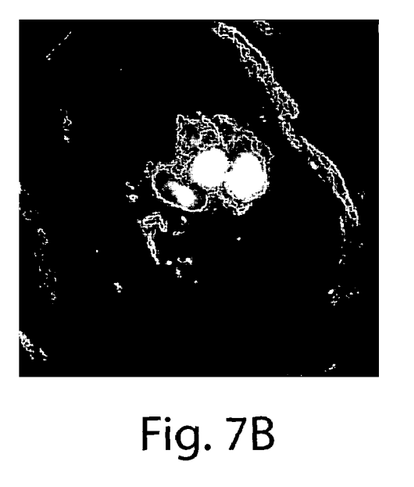
Figure 7C:
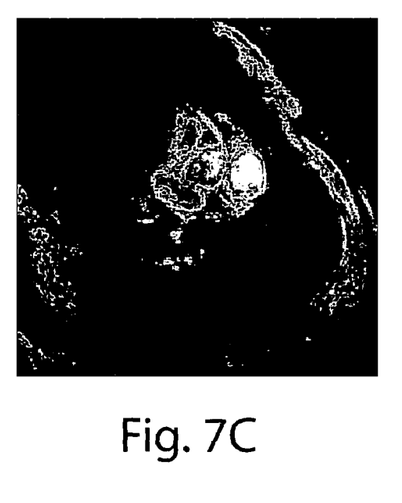
Figure 7D:
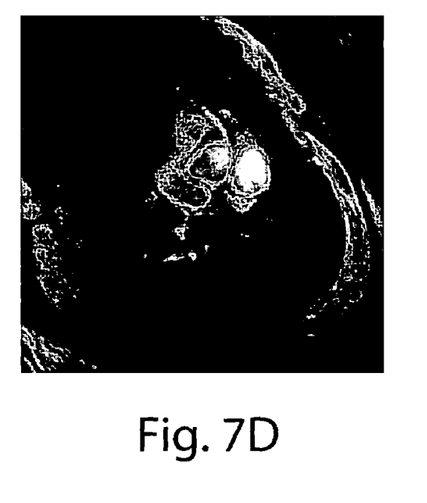
Figure 8A:
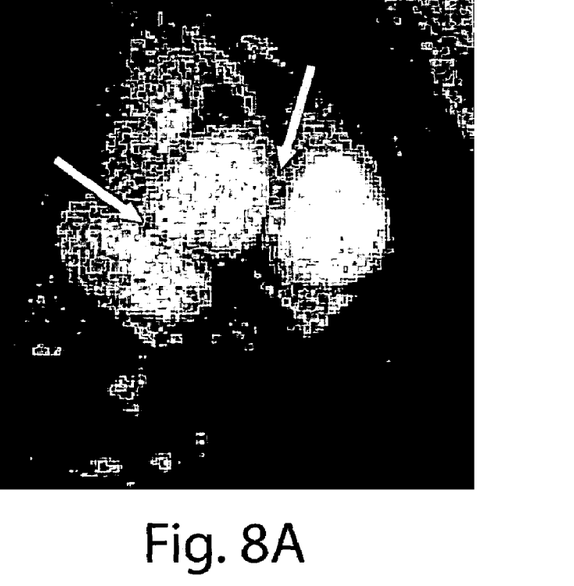
FIGS. 8(a)-8(b) depict—respectively, before and after off-resonance correction—a selected cardiac region from an image reconstructed using the POCSENSINNG algorithm.
Figure 8B:
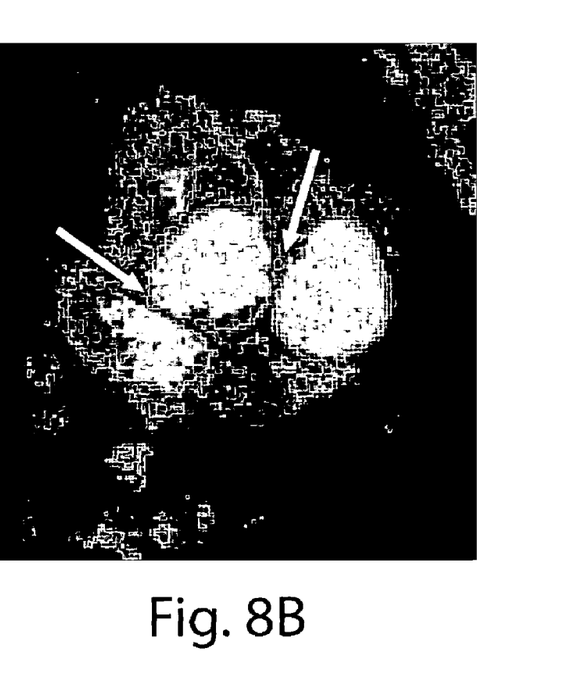

FIG. 8(a) shows the selected 128×128 region of cardiac image FIG. 7(c). FIG. 8(b) is the same image region after off-resonance correction. Spiral off-resonance blurring artifacts are effectively reduced after off-resonance correction. For example, as seen in the regions indicated by arrows, the edge definitions of aorta and main pulmonary artery are improved after off-resonance correction.

Discussion

The data-consistency constraint required for POCSENSE is difficult to apply when k-space data are acquired non-uniformly. However, this constraint can be readily imposed on the data sets in the POCSENSINNG algorithm as it takes advantage of large rescaled matrices. The previously proposed Conjugate Gradient (CG) iteration method performs gridding operations for both forward (k-space to image) and reverse (image to k-space) directions as well as sampling density compensation at each iteration (2). The POCSENSINNG algorithm obviates the need for these complicated gridding procedures; it simply inserts the acquired k-space data into corresponding locations in large rescaled matrices at each iteration. The INNG algorithms do not require density compensation and leads to accurate image reconstruction with sufficiently large scaling factor (5). The POCSENSINNG algorithm takes advantages of this characteristic of the INNG algorithms.

As seen in FIG. 5, FFT ((d)→(e)) and IFFT ((f)→(b)) are the most computationally intensive parts in the POCSENSINNG algorithm. The computational costs of other operations (e.g., combine images $g_i$ to g ((b)→(c)), multiply g by $S_i$ ((c)→(d)), insert $K_i$ to $G_i$ ((e)→(f))) are insignificant compared to those of FFTs. Therefore, the reconstruction time mainly depends on the size of rescaled matrices and the number of FFT to be performed in the POCSENSINNG algorithm. For example, in the image reconstruction of FIGS. 6 and 7 (512×512 rescaled matrices and 4 receiver channels), one iteration took about 3.3 s in a workstation with an Intel Pentium IV processor operating at 1.70 GHz and 512 MB RAM.

As is evident, a large scaling factor s is desirable to reduce the data shift errors in the rescaled matrices. In the INNG algorithms (5), it is suggested that s=4 be usually sufficient in practice. The POCSENSINNG algorithm with s=4 was also applied to the same data as used to reconstruct FIGS. 6 and 7 (these images are not shown). However, there was little perceptible difference between the images reconstructed with s=4 and those with s=2 (i.e., FIGS. 6(c) and 7(c)). Hence, from these particular experiments, s=2 is likely to be sufficient for in-vivo MR data in the POCSENSINNG algorithm. As explained, when large s needs to be set, the facilitated INNG algorithm can be utilized in the POCSENSINNG algorithm to reduce the number of iterations. In other words, s is consecutively increased during the iterations. However, even if this approach is taken in the POCSENSINNG algorithm, the computation time is usually significantly increased when FFTs are performed on the rescaled matrices with a large s. This can be understood from the fact that the total number of complex multiplications required for sN×sN 2D-FFT is 2 $(sN)^2 \log_2 (sN)$. As described, the aforedescribed experiments have shown that s=2 is likely to be sufficient for in-vivo MR data. The fact that a relatively small scaling factor can be used without significant errors also facilitates the computation in the POCSENSINNG algorithm, particularly when n (the number of receiver channels) is large.

As indicated in Eq.[3], the background is forced to be zeros in the combined image g at each iteration in the POCSENSINNG algorithm. Therefore, the image signal-to-noise ratio (SNR) is difficult to evaluate in the image reconstructed using the POCSENSINNG algorithm because the background noise level is usually significantly low. The data shift errors in the large rescaled matrices usually result in the reduction of image SNR in the INNG algorithms (5). In this example, the noise level in cardiac region in FIG. 7(c) appear higher than that in the same region of the full data set image FIG. 7(d). On the other hand, the noise level in the image reconstructed using the POCSENSINNG algorithm with s=4 (image not shown) is visually not significantly different from that of FIG. 7(c). This observation suggests that the decreased image SNR of FIG. 7(c) compared with FIG. 7(d) results mainly from the reduced data acquisition instead of data shift errors in the large rescaled matrices.

In spiral trajectories, $B_0$ inhomogeneity often causes blurring artifacts in the image. This is one primary disadvantage of spiral imaging (11). Off-resonance correction were applied to the selected region of the cardiac image reconstructed using the POCSENSINNG algorithm (FIG. 7(c)). When FIG. 8(b) (after correction) is compared with FIG. 8(a) (before correction), it can be seen that the blurring artifacts are effectively reduced after off-resonance correction. As this example demonstrates, spiral off-resonance artifacts can be effectively reduced if a correction algorithm is applied to the image reconstructed using the POCSENSINNG algorithm. In other words, if the POCSENSINNG algorithm is used, off-resonance correction needs to be performed only once after the image is reconstructed. On the other hand, in the previously proposed CG iteration method, it is suggested that off-resonance correction may be incorporated in the gridding operations of CG procedures (2). The fact that spiral off-resonance correction can be performed after the iterations are complete in the POCSENSINNG algorithm also speeds up the reconstruction when off-resonance artifacts need to be corrected in spiral imaging.

The proposed POCSENSINNG algorithm is an extension of POCSENSE to non-uniform sampling schemes using INNG algorithms. It takes advantage of large rescaled matrices and thus all the constraints necessary for POCSENSE can be readily imposed at each iteration. It also avoids the need for complicated gridding procedures. The POCSENSINNG algorithm is a useful practical reconstruction algorithm for sensitivity encoded data with arbitrary k-space trajectories.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

The contents of all references, including patents and published patent applications, cited throughout this application are hereby incorporated by reference in entirety.

What is claimed is:

1. A method, comprising:

acquiring non-rectilinearly sampled k-space data from a set of magnetic resonance (MR) coils having a set of coil sensitivity profiles;

distributing the non-rectilinearly sampled k-space data onto a first resealed matrix having a first scaling factor, where the distributing is performed without using a density compensation function (DCF) and without using a singular value decomposition (SVD) regularization parameter adjustment;

reconstructing subsets of a first MR image from the first resealed matrix by applying a basic Iterative Next Neighbor Gridding (INNG) process to subsets of the first resealed matrix;

selectively zeroing portions of the subsets of the first MR image;

building the first MR image from the subsets of the first MR image;

placing the first MR image in a second rescaled matrix having a second scaling factor;

modifying the non-rectilinearly sampled k-space data into modified k-space data based, at least in part, on the set of coil sensitivity profiles and sensitivity encoding (SENSE);

distributing the modified k-space data onto the second rescaled matrix, where the distributing is performed without using a DCF, the second scaling factor being larger than the first scaling factor;

reconstructing subsets of a second MR image from the second rescaled matrix by applying the basic INNG process to subsets of the second rescaled matrix;

selectively zeroing portions of the subsets of the second MR image;

building the second MR image from the subsets of the second MR image; and displaying the second MR image.

2. The method of claim 1, including:

placing the second MR image in a third rescaled matrix having a third scaling factor, the third scaling factor being greater than the second scaling factor;

re-modifying the non-rectilinearly sampled k-space data into re-modified k-space data based, at least in part, on the set of coil sensitivity profiles and sensitivity encoding (SENSE);

distributing the re-modified k-space data onto the third rescaled matrix, where the distributing is performed without using a DCF;

reconstructing subsets of a third MR image from the third rescaled matrix by applying the basic INNG process to subsets of the third rescaled matrix;

selectively zeroing portions of the subsets of the third MR image;

building the third MR image from the subsets of the third MR image; and displaying the third MR image.

3. The method of claim 2, including:

placing the third MR image in a fourth rescaled matrix having a fourth scaling factor, the fourth scaling factor being larger than the third scaling factor;

distributing the re-modified k-space data onto the fourth rescaled matrix, where the distributing is performed without using a DCF;

reconstructing subsets of a fourth MR image from the fourth rescaled matrix by applying the basic INNG process to subsets of the fourth rescaled matrix;

selectively zeroing portions of the subsets of the fourth MR image;

building the fourth MR image from the subsets of the fourth MR image; and displaying the fourth MR image.

4. The method of claim 1, where distributing the non-rectilinearly sampled k-space data includes determining a location to place a data value by rounding off an original k-space co-ordinate after multiplying by a scale factor.

* * * * *